United States Patent [19]
Chan et al.

[11] Patent Number: 5,546,047
[45] Date of Patent: Aug. 13, 1996

[54] METHOD AND APPARATUS OF AN OPERATIONAL AMPLIFIER WITH WIDE DYNAMIC RANGE

[75] Inventors: Joseph Y. Chan; Mathew A. Rybicki, both of Austin, Tex.

[73] Assignee: Motorola, Inc., Schaumburg, Ill.

[21] Appl. No.: 395,126

[22] Filed: Feb. 27, 1995

[51] Int. Cl.$^6$ .................................................. H03F 3/45
[52] U.S. Cl. .................................... 330/253; 330/255
[58] Field of Search .................................... 330/253, 255, 330/264, 268

[56] References Cited

U.S. PATENT DOCUMENTS

| | | | |
|---|---|---|---|
| 4,296,382 | 10/1981 | Hoover | 330/264 |
| 4,800,339 | 1/1989 | Tanimoto et al. | 330/253 |
| 5,289,058 | 2/1994 | Okamoto | 330/255 X |

Primary Examiner—James B. Mullins
Attorney, Agent, or Firm—Timothy W. Markison; Paul J. Polansky

[57] ABSTRACT

An operational amplifier (10) having an inverted output (20) ranging from a return voltage up to a rail supply voltage includes an amplifying stage (12) and: a linear output inverter (14). The linear output inverter (14) includes an inverting pull down stage (16), an output stage controller (17), and a pull up output stage (18). The inverting pull down stage (16) operates to pull the inverted output down to the return voltage when the inverted output is below a first threshold. The pull up output stage (18) operates to pull the inverted output up to the rail voltage when the inverted output (20) is above a second threshold. The first threshold is greater than the second threshold such that both the inverting pull down stage (16) and the pull up output stage (18) operate when the inverted output (20) lies between the first threshold and the second threshold.

17 Claims, 4 Drawing Sheets

5,546,047

METHOD AND APPARATUS OF AN OPERATIONAL AMPLIFIER WITH WIDE DYNAMIC RANGE

TECHNICAL FIELD OF THE INVENTION

This invention relates generally to amplification of analog signals and more particularly to a low power amplifier having a wide dynamic range output.

BACKGROUND OF THE INVENTION

Operational amplifiers have been known for many years and serve many varied needs in circuit designs. For example, operational amplifiers are used in many battery operated circuits. To extend the battery life of such battery operated circuits, the battery operated circuits are being designed to operate from lower supply voltages. As is known, by reducing the supply voltage, the battery life of a battery operated circuit can be extended.

As the drive for extended battery life pushes supply voltages lower and lower, dynamic output range of operational amplifiers becomes a critical design issue. As is known, the output of an operational amplifier has a dynamic range that is less than rail to rail, i.e., from the supply voltage to the return voltage. With a dynamic output range less than the rail to rail capabilities, the output of an amplifier may be insufficient to drive a subsequent stage in the circuit. For example, if the supply voltage is 2.7 Volts, a typical dynamic output range will be 0.1 Volts to 2.1 Volts. (Various output ranges, and the masons therefor, will be discussed below with reference to prior an FIGS. 1–3.) When the operational amplifier is supplying its output to a digital circuit, the 2.1 Volts, in many applications, is insufficient to provide a logic "1", where a voltage of 2.5 Volts is typically needed to guarantee a logic "1".

FIGS. 1–3 illustrate various operational amplifiers and their corresponding dynamic output range. FIG. 1 illustrates a basic operational amplifier which has been known in the art for sometime and provides an amplification of the difference between a first input signal and a second input signal. The dynamic range of the output, however, ranges only from the reference ground potential, zero for this particular example, to a voltage level of ($V_{DD}-(V_{GS}+V_{DS})$). Thus, the prior art operational amplifier could not pull its output up to the supply voltage $V_{DD}$, but only up to the supply voltage minus the gate to source voltage of one of the field effect transistor (0.6 Volts) plus the drain to source voltage of a field effect transistor in the current source (0.2 Volts). For a 2.7 Volt supply, the maximum output voltage of the operational amplifier is 1.9 Volts (2.7–(0.6 +0.2)).

FIG. 2 illustrates another prior art operational amplifier that has an improved dynamic range over the operational amplifier of FIG. 1. This embodiment includes a basic operational amplifier and an additional circuit coupled to the output of the operational amplifier. The additional circuit allows the output voltage to be pulled down to a reference ground potential of zero and up to $V_{DD}-V_{GS}$. Thus, the additional circuit improves the dynamic range of the amplifier of FIG. 1 by eliminating the $V_{DS}$ term, however, the gate to source voltage $V_{GS}$ limits the upper voltage level of the output. For a 2.7 Volt supply, the maximum output voltage of the operational amplifier is 2.1 Volts (2.7–0.6).

FIG. 3 illustrates still another prior art operational amplifier. The configuration of FIG. 3 includes a basic operational amplifier having its output coupled to an additional circuit. The additional circuit included a current source and an n-channel field effect transistor (FET). While the output of the amplifier can be pulled up to ($V_{DD}-V_{DS}$), a higher level than either the output of the amplifiers shown in FIG. 1 and FIG. 2, the output can only be pulled down to a level of $V_{DS}$ because the n-channel FET. For a 2.7 Volt supply, the output range of the operational amplifier is 0.2 Volts to 2.5 Volts.

Thus, these prior art amplifiers fail to provide a sufficiently wide dynamic range that could be used in low voltage circuitry. Therefore, a need exists for an operational amplifier that has a wide dynamic range and that may be used in low voltage level applications.

DETAILED DESCRIPTION OF THE DRAWINGS

Generally, the present invention provides an operational amplifier that has a wide dynamic range and that may be employed in low power applications. More particularly, the present invention provides an operational amplifier having an amplifying stage and a linear output inverter that provides both a pull down stage and a pull up stage in order to provide a complete dynamic range from a low voltage level up to a rail voltage.

Figure 4:
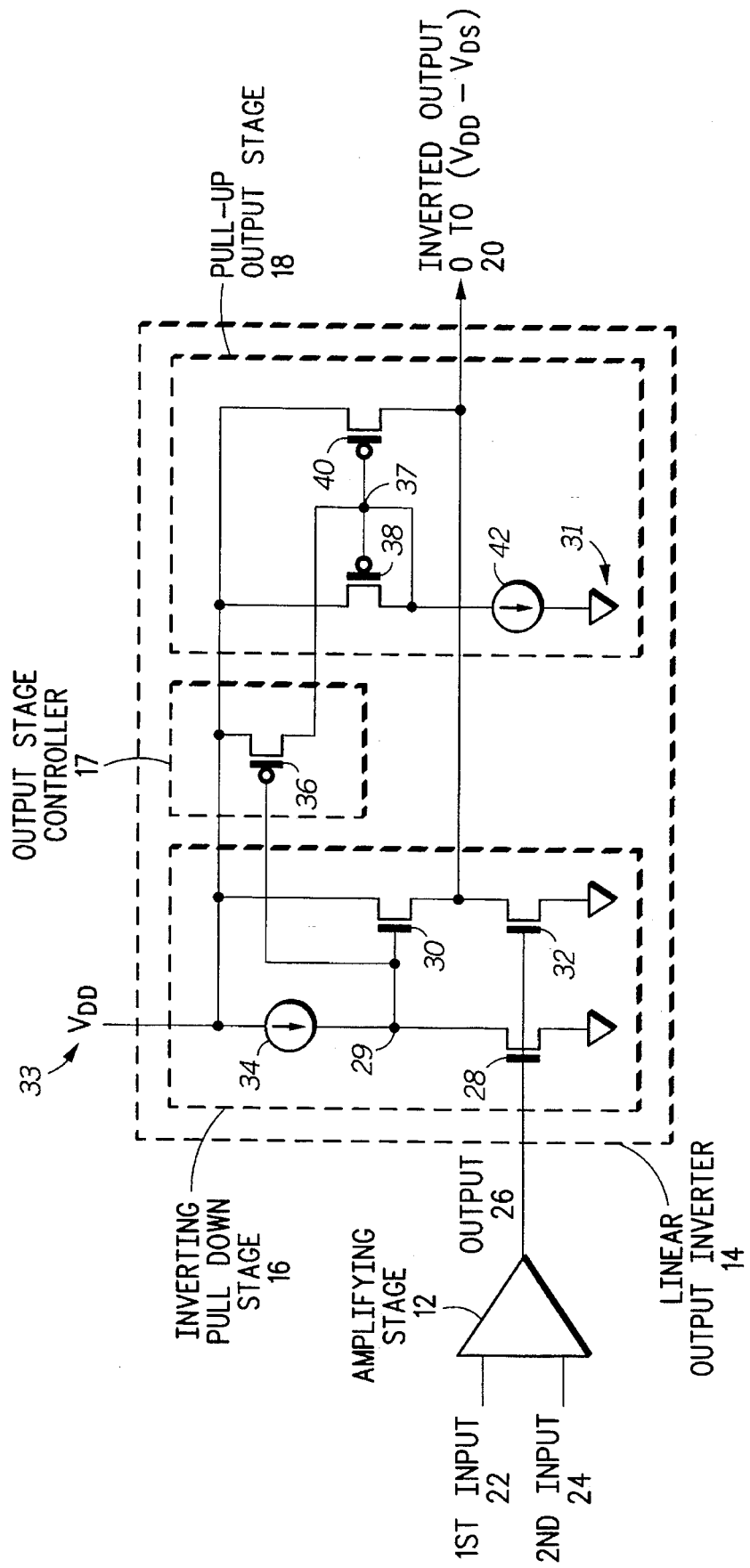
FIG. 4 illustrates a block diagram of a first operational amplifier embodying the teachings of the present invention.

FIG. 4 illustrates an operational amplifier 10 incorporating the teachings of the present invention. The operational amplifier 10 comprises an amplifying stage 12 and a linear output inverter 14. The linear output inverter 14 includes an inverting pull down stage 16, an output stage controller 17, and a pull up output stage 18.

Figure 1:
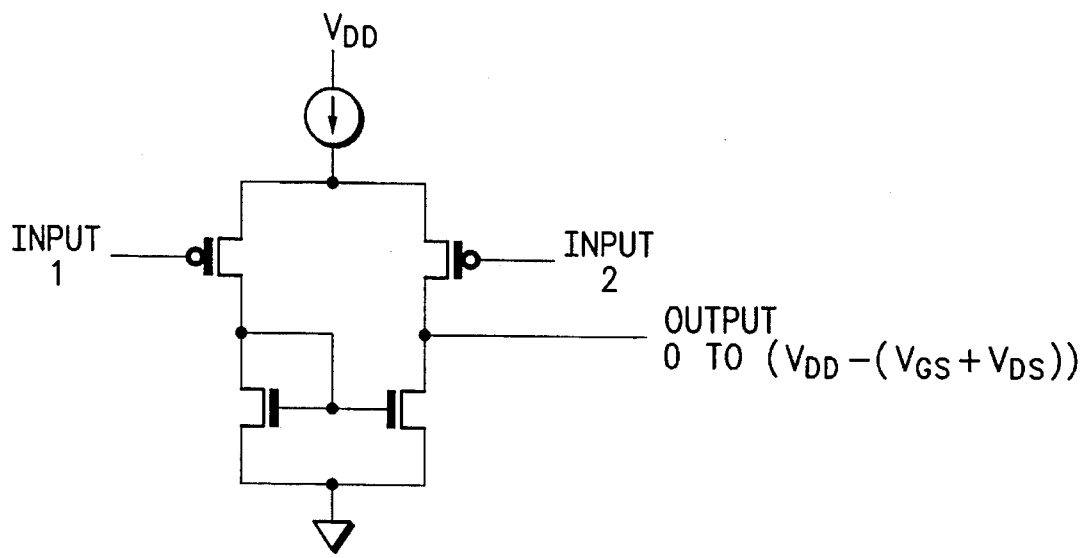
FIG. 1 illustrates a block diagram of a first prior art operational amplifier configuration.
Figure 2:
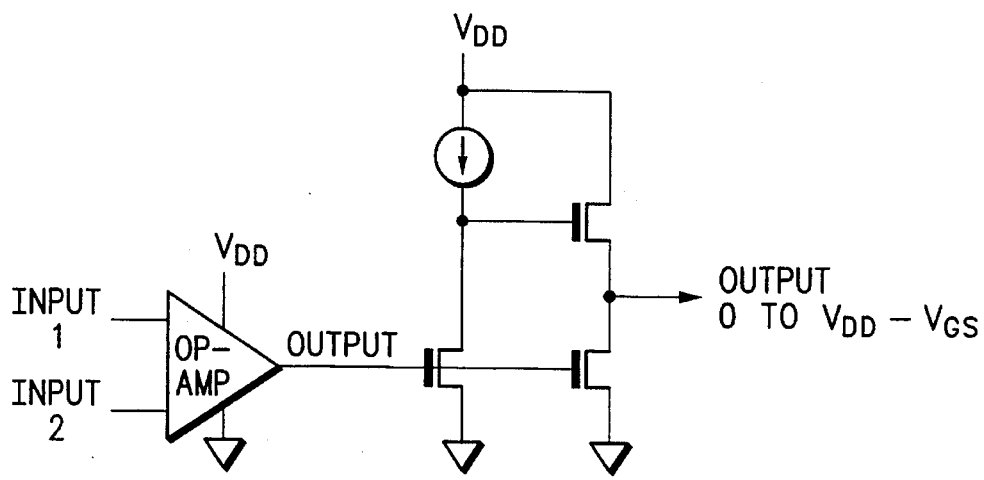
FIG. 2 illustrates a block diagram of a second prior art operational amplifier configuration.
Figure 3:
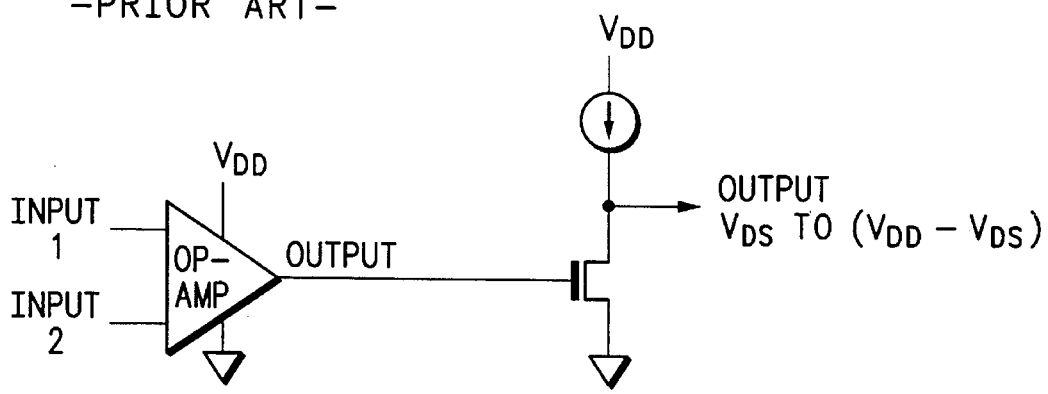
FIG. 3 illustrates a block diagram of a third prior art operational amplifier configuration.

The amplifying stage 12 receives the first input 22 and a second input 24 and produces an amplified output 26. The amplifying stage preferably comprises an operational amplifier of a configuration known in the art, such as the configuration illustrated in FIG. 1. Nevertheless, to one skilled in the art, any type of operational amplifier will suffice and receive benefit from the present invention.

The inverting pull down stage 16 comprises a first transistor 28, a second transistor 30, a third transistor 32, and a current source 34. In the embodiment shown in FIG. 4, transistors 28, 30, and 32 comprise N-channel FETs. However, one skilled in the art will readily appreciate that bipolar transistors, or any type of gateable device, could be used in the construction of the operational inverting pull down stage 16 as well. The first transistor 28 has its gate coupled to the output 26, its drain coupled to a first node 29, and its source coupled a reference ground 31. The second transistor 30 has its gate coupled to the first node 29, its drain coupled to a reference voltage $V_{DD}$ 33, and its source coupled to the inverted output node 20. The third transistor 32 has its gate coupled to the output 26, its drain coupled to the inverted output node 20, and its source coupled to the reference ground 31. The current source connects between the reference voltage $V_{DD}$ 33 and the first node 29, with current biased toward the first node 29.

The pull up output stage 18 comprises a fourth transistor 38, a fifth transistor 40, and a current source 42. Preferably, both the fourth transistor 38 and fifth transistor 40 comprise p-channel FETs. However, one skilled in the art will readily appreciate that bipolar transistors, or any type of gateable device, could be used in the construction of the operational amplifier 10 as well. The fourth transistor 38, preferably a p-channel FET, has its gate and its drain coupled to a second node 37 and its source coupled to the reference voltage, or rail voltage, $V_{DD}$ 33. The fifth transistor 40 has its gate coupled to the second node 37, its source coupled to the source voltage $V_{DD}$ 33, and its drain coupled to the inverted output node 20. The current source 42 connects between the second node 37 and the reference ground 31, with current biased toward the reference ground, or return voltage, 31.

The output stage controller 17 comprises a sixth transistor 36, preferably a p-channel FET. The sixth transistor 36 has its gate couple to the first node 29, its source coupled to the reference voltage $V_{DD}$ 33, and its drain coupled to the second node 37. The output stage controller 17 linearly, or gradually, activates the pull up output stage 18 causing the pull up output stage 18 to pull the inverted output node 20 voltage level up to a level $V_{DD}-V_{DS}$, where $V_{DS}$ represents the voltage from the drain to source of the fifth transistor 40.

In operation, the linear output inverter 14 inverts the output 26 signal to produce an inverted output 20 having a dynamic range from a return voltage level, preferably the level of the reference ground 31, up to a rail supply voltage level. The rail supply voltage level is at the level ($V_{DD}-V_{DS}$), where $V_{DS}$ is the voltage across the p-channel FET 40 and of course $V_{DD}$ 33 is the level of the reference voltage. When the output 26 is at a high level, the first transistor 28 and the second transistor 32 are turned on, thus pulling the inverted output 20 down to the return voltage level. The voltage at node 29 therefore is at a low level and the sixth transistor 36 associated with the output stage controller 17 is turned on. The output stage controller 17 resultantly pulls the voltage on the second node 37 to a high level therefore turning off the fourth transistor 38 and the fifth transistor 40. In this state, the pull up output stage 18 is deactivated and does not affect the inverted output 20.

As the output 26 decreases in value, the first transistor 28 and the third transistor 32 gradually turn off and gradually raise the voltage at the first node 29. Resultantly, the output stage controller 17 gradually changes state, such that the sixth transistor 36 gradually turns off. As the sixth transistor 36 turns off, the voltage on the second node 37 is pulled lower by the second current source 42. Resultantly, the fourth transistor 38 and the fifth transistor 40 are gradually turned on. As the fourth transistor 38 and the fifth transistor 40 are turned on, the pull up output stage 18 pulls up the inverted output 20 level to $V_{DD}-V_{DS}$. Eventually, the sixth transistor 36 of the output stage controller 17 is completely turned off, such that the pull up output stage 18 is fully controlling the inverted output 20 signal.

In its full range of operation, the inverting pull down stage 16 provides by itself the inverted output 20 when the inverted output is below a first threshold, where the first threshold is approximately the gate-source voltage of transistor 28 and/or transistor 32. As the inverted output 20 level rises above the first threshold, both the inverting pull down stage 16 and the pull up output stage 18 contribute to the inverted output 20. As the inverted output 20 rises above a second threshold, the inverting pull down stage 16 no longer contributes to the inverted output 20 signal and the pull up output stage 18, alone, produces the inverted output 20 signal. Thus, the operational amplifier of the present invention provides a linear amplification function across a wide dynamic range, i.e., from 0 to $V_{DD}-V_{DS}$. For a 2.7 Volt supply, the output range of the amplifier of FIG. 4 is 0 Volts to 2.5 Volts, which provides a sufficient voltage for digital circuitry.

Figure 5:
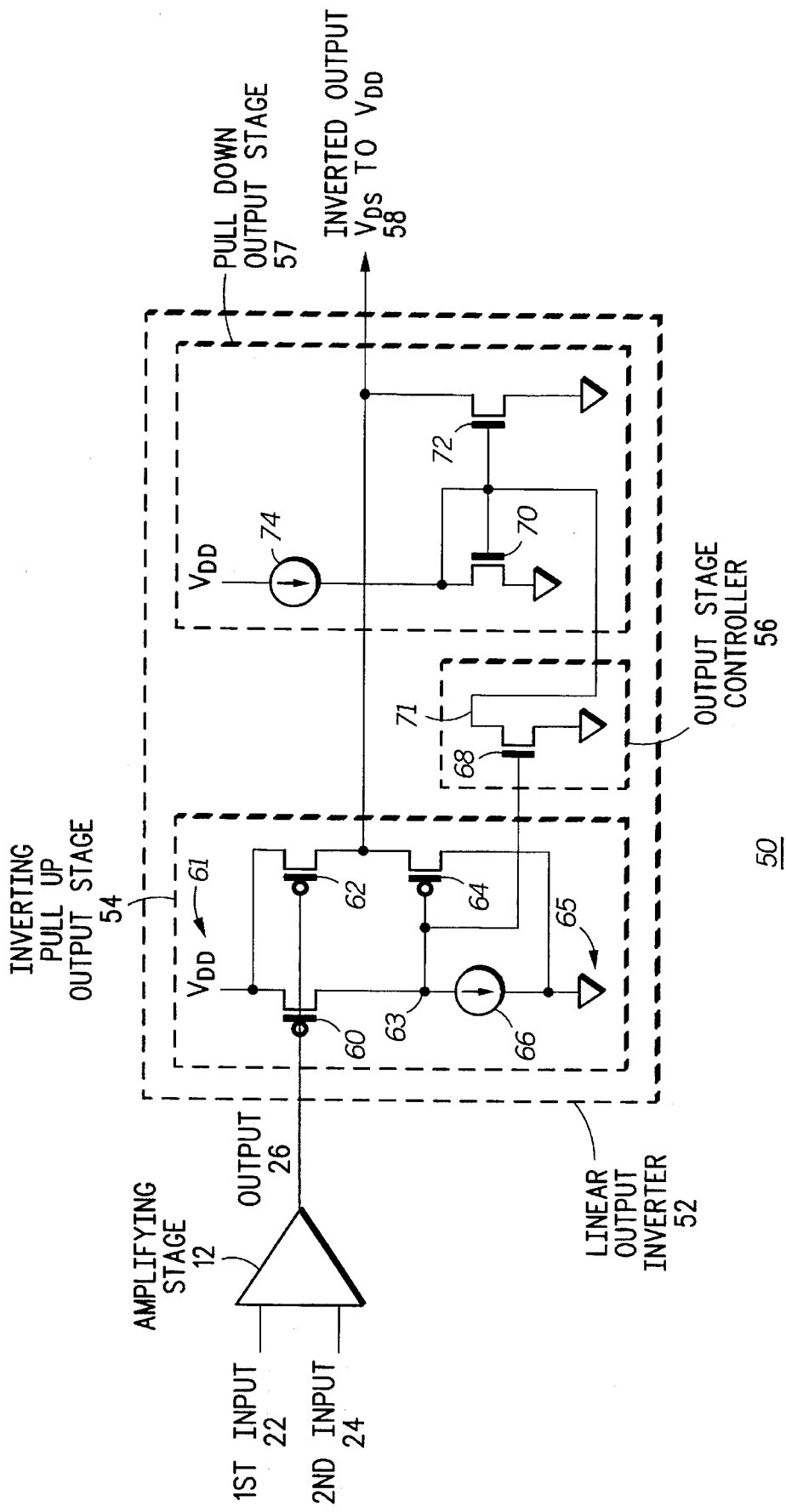
FIG. 5 illustrates a block diagram of a second operational amplifier embodying the teachings of the present invention.

FIG. 5 illustrates an alternate operational amplifier 50 embodying the principles of the present invention. The operational amplifier 50 is constructed in a manner similar to the operational amplifier 10, except with symmetrical components connected in a symmetrical fashion. Thus, common components contain common numerical identification.

The operational amplifier 50 comprises an amplifying stage 12 and a linear output inverter 52 that work in unison to produce an inverted output 58 having a dynamic range from $V_{DS}$ to $V_{DD}$. The linear output inverter 52 comprises an inverting pull up output stage 54, a pull down output stage 57, and an output stage controller 56 to produce the inverted output 58.

The amplifying stage 12 receives a first input 22 and a second input 24 and produces an amplified output 26. Preferably, the amplifying stage comprises an operational amplifier that is known in the art and not further described herein.

The inverting pull up output stage 54 comprises a first transistor 60, a second transistor 62, a third transistor 64, and a current source 66. Preferably, the first transistor 60, second transistor 62, and third transistor 64 comprise p-channel FETs. However, one skilled in the art will readily appreciate that bipolar transistors could be used in the construction of the operational amplifier 50 as well. The first transistor 60 connects such that its gate couples to the output 26, its source couples to a reference voltage $V_{DD}$ 61, and its drain couples to a first node 63. The second transistor 62 connects such that its gate couples to the output 26, its source couples to the reference source voltage $V_{DD}$ 61, and its drain couples to the inverted output 58. The third transistor 64 connects such that its gate couples to the first node 63, its source couples to the inverted output node 58, and its drain couples to a reference ground 65. The current source 66 connects between the first node 63 and a reference ground 65 with the current biased toward the reference ground 65.

The pull down output stage 57 comprises a fourth transistor 70, a fifth transistor 72, and a current source 74. Preferably, both the fourth transistor 70 and the fifth transistor 72 are n-channel FETs. However, one skilled in the art will readily appreciate that bipolar transistors could be used in the construction of the operational amplifier 50 as well. The fourth transistor 70 connects such that its gate and its drain couple to a second node while its source couples to the reference ground 65. The fifth transistor 72 connects such that its gate couples to the second node 71, its drain couples to the inverted output node 58, and its source couples to the reference ground 65. The current source 74 connects between the reference source voltage $V_{DD}$ 61 and the second node 71, with the current biased toward second node 71.

The output stage controller 56 comprises a sixth transistor 68, preferably an n-channel FET, connected with its gate coupled to the first node 63, its drain coupled to the second node 71, and its source coupled to the reference ground 65. The output stage controller 56 linearly enables the pull down output stage 57 to allow the pull down output stage 57 to pull down the inverted output 58 to $V_{DS}$.

In operation, the inverting pull up output stage 54 operates to provide, by itself, the inverted output 58 when the inverted output 58 is above a first threshold. The pull down output stage 57 operates to provide, by itself, the inverted output 58 when the inverted output 58 is below a second threshold. When the inverted output 58 is at a level between the first and second threshold, both the inverting pull up output stage 54 and the pull down output stage 57 contribute to the production of the inverted output 58.

During normal operation, when the output 26 is at a low level, the first transistor 60 and the second transistor 62 are turned on. Resultantly, the inverted output is pulled up to $V_{DD}$. In this state, the first node 63 is at a high voltage level. Therefore, the sixth transistor 68 of the output stage controller 56 is turned on, the voltage on the second node 71 is low, and the fourth transistor 70 and fifth transistor 72 are turned off. Because of this, the pull down output stage 57 does not contribute to the inverted output 58, and the inverting pull up output stage 54 provides the full inverted output 58 signal. Therefore, the inverted output 58 is above the first threshold.

As output 26 voltage increases, the first transistor 60 and the second transistor 62 gradually turn off. Resultantly, the voltage on the first node gradually goes lower, and the third transistor gradually turns on while the sixth transistor 68 gradually turns off. The voltage on the second node 71 moves gradually to a higher level and the fourth transistor 70 and fifth transistor 72 gradually turn on causing the pull down output stage 57 to contribute to the inverted output 58. When both the inverting pull up output stage 54 and pull down output stage 57 contribute to the inverted output 58, the inverted output 58 lies between the first threshold and the second threshold.

Eventually, as the output 26 level increases, the inverting pull up output stage 54 turns off and does not provide the inverted output 58. At this point, the inverted output 58 lies below the second threshold and the pull down output stage 57 provides fully the inverted output 58 down to the voltage level slightly above the reference voltage at a level $V_{DS}$.

Thus, the operational amplifiers 10 and 50 of the present invention provide important advantages over the prior operational amplifiers. The operational amplifiers 10 and 50 provide a wide dynamic range without greatly increasing the complexity of the amplification circuitry. In this manner, an operational amplifier can be easily integrated into a low voltage integrated circuit that provides the benefits of a wide dynamic range without substantial added complexity.

Figure 6:
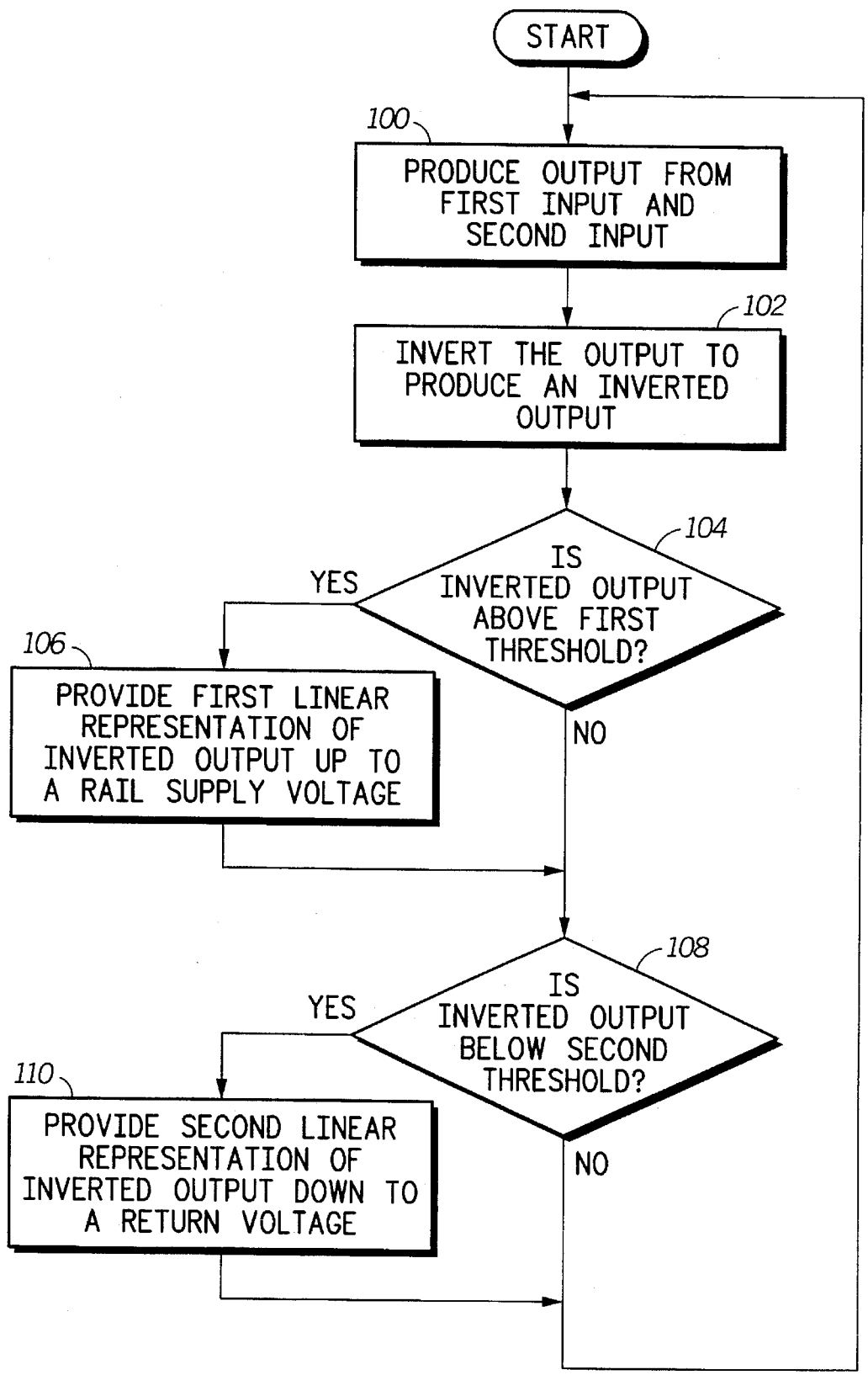
FIG. 6 illustrates a logic diagram of a method of the present invention for providing an amplified output having a wide dynamic range.

FIG. 6 illustrates a logic diagram of a method of the present invention for providing an amplified output over a wide dynamic range. The method starts at block 100, wherein an output 26 is produced from first input 22 and the second input 24. The method proceeds to block 102, where the output 26 is inverted to produce an inverted output 58. From block 102, the method proceeds to decision block 104, where the inverted output is compared to a first threshold. If the inverted output exceeds the first threshold, the method proceeds to block 106 wherein a first linear representation of the inverted output is provided up to a rail supply voltage. If, at decision block 104, the inverted output does not exceed the first threshold, the method proceeds to decision block 108. Also, from block 106, the method proceeds to decision block 108. At decision block 108, the inverted output is compared to a second threshold. If the inverted output is below the second threshold, the method proceeds to block 110, wherein a second linear representation of the inverted output is provided down to a return voltage. If, at block 108, the inverted output is not below the second threshold, the method proceeds to block 100. From block 110, the method proceeds to block 100. Thus, the method of the present invention provides linear representations of the inverted output from a low of a return voltage up to a rail supply voltage, the method corresponding to the operation of the apparatus of the present invention.

The above described preferred embodiments are intended to illustrate the principles of the invention, but not to limit the scope of the invention. Various other embodiments and modifications to these preferred embodiments may be made by those skilled in the art without departing from the scope of the following claims.

We claim:

1. An operational amplifier having a wide dynamic output, the operational amplifier comprising;
   (a) an amplifying stage having a first input, a second input, a second input, and an output;
   (b) an inverting pull down output stage operably coupled to the output, wherein the inverting pull down output stage inverts a signal present at the output to produce an inverted ouput at an inverted output node, and wherein the inverting pull down output stage including:
      (i) first transistor operably coupled to the ouput, a first node, and a reference ground,
      (ii) first current source operably coupled to a reference voltage and the first node,
      (iii) second transistor operably coupled to the first node, the reference voltage, and the inverted output node, and
      (iv) third transistor operably coupled to the output, the inverted output node, and the reference ground,
   (c) a pull up output stage operably coupled to the inverting pull down output stage, wherein the pull up output stage, when enabled, provides a linear representation of the inverted output up to rail supply voltage, the pull up output stage including;
      (i) fourth transistor operably coupled to a second node and the reference voltage,
      (ii) fifth transistor operably coupled to the second node, the reference voltage, and the inverted output node, and
      (iii) a second current source operably coupled to the second node and the reference ground; and
   (d) output stage controller operably coupled to the inverting pull down output stage and the pull up output stage, wherein the output stage controller enables the pull up output stage based on the signal present at the output, such that the operational amplifier has a wide dynamic range.

2. The operational amplifier of claim 1 wherein:
   the first, second, and third transistors comprise n-channel field effect transistors; and
   the fourth and fifth transistors comprise p-channel field effect transistors.

3. An operational amplifier comprising an amplifier having a first input terminal for receiving an input signal thereon, and an output terminal, and an inverting stage having an input terminal coupled to the output terminal of the amplifier, and a first output terminal coupled to an output terminal of the operational amplifier, the improvement wherein the operational amplifier further comprises:
   a rail output stage having a first terminal coupled to a first power supply voltage terminal, an enable input terminal, and an output terminal coupled to the output terminal of the operational amplifier; and an output stage controller having an input terminal coupled to said inverting stage, and an output terminal coupled to said enable input terminal of said rail output stage, said output stage controller gradually enabling said rail output stage as a voltage provided by said inverting stage approaches a voltage of said first power supply voltage terminal.

4. The operational amplifier of claim 3 wherein said output stage controller has an input terminal coupled to a second output terminal of the inverting stage.

5. The operational amplifier of claim 4 wherein said output stage controller comprises a transistor having a first current electrode coupled to said first power supply voltage terminal, a control electrode coupled to said second output terminal of the inverting stage, and a second current electrode coupled to said enable input terminal of said rail output stage.

6. The operational amplifier of claim 5 wherein said transistor is characterized as being a metal oxide semiconductor (MOS) transistor.

7. The operational amplifier of claim 3 wherein said rail output stage comprises:
- a first transistor having a first current electrode coupled to said first power supply voltage terminal, a control electrode for providing said enable input terminal of said rail output stage, and a second current electrode coupled to said control electrode thereof;
- a current source having a first terminal coupled to said second current electrode of said first transistor, and a second current electrode coupled to a second power supply voltage terminal; and
- a second transistor having a first current electrode coupled to said first power supply voltage terminal, a control electrode coupled to said second current electrode of said first transistor, and a second current electrode coupled to the output terminal of the operational amplifier.

8. The operational amplifier of claim 7 wherein said first and second transistors are characterized as being a metal oxide semiconductor (MOS) transistors.

9. The operational amplifier of claim 3 wherein the inverting stage comprises:
- a current source having a first terminal coupled to said first power supply voltage terminal, and a second terminal;
- a first transistor having a first current electrode coupled to said second terminal of said current source, a control electrode coupled to the output terminal of the amplifier, and a second current electrode coupled to a second power supply voltage terminal;
- a second transistor having a first current electrode coupled to said first power supply voltage terminal, a control electrode coupled to said second terminal of said current source, and a second current electrode coupled to the output terminal of the operational amplifier; and
- a third transistor having a first current electrode coupled to said second current electrode of said second transistor, a control electrode coupled to the output terminal of the amplifier, and a second current electrode coupled to said second power supply voltage terminal.

10. The operational amplifier of claim 3 wherein said amplifier further comprises a second input terminal, and wherein said input signal is formed between said first and second input terminals of said amplifier.

11. A linear output inverter comprising:
- an inverting stage having an input terminal for receiving an input signal, and a first output terminal coupled to an output terminal of the linear output inverter;
- a rail output stage having a first terminal coupled to a first power supply voltage terminal, an enable input terminal, and an output terminal coupled to an output terminal of the linear output inverter; and
- an output stage controller having an input terminal coupled to said inverting stage, and an output terminal coupled to said enable input terminal of said rail output stage, said output stage controller gradually enabling said rail output stage as a voltage provided by said inverting stage approaches a voltage of said first power supply voltage terminal.

12. The linear output inverter of claim 11 wherein said output stage controller has an input terminal coupled to a second output terminal of said inverting stage.

13. The linear output inverter of claim 12 wherein said output stage controller comprises a transistor having a first current electrode coupled to said first power supply voltage terminal, a control electrode coupled to said second output terminal of the inverting stage, and a second current electrode coupled to said enable input terminal of said rail output stage.

14. The linear output inverter of claim 13 wherein said transistor is characterized as being a metal oxide semiconductor (MOS) transistor.

15. The linear output inverter of claim 11 wherein said rail output stage comprises:
- a first transistor having a first current electrode coupled to said first power supply voltage terminal, a control electrode for providing said enable input terminal of said rail output stage, and a second current electrode coupled to said control electrode thereof;
- a current source having a first terminal coupled to said second current electrode of said first transistor, and a second current electrode coupled to a second power supply voltage terminal; and
- a second transistor having a first current electrode coupled to said first power supply voltage terminal, a control electrode coupled to said second current electrode of said first transistor; and a second current electrode coupled to the output terminal of the linear output inverter.

16. The linear output inverter of claim 15 wherein said first and second transistors are characterized as being a metal oxide semiconductor (MOS) transistors.

17. The linear output inverter of claim 11 wherein the inverting stage comprises:
- a current source having a first terminal coupled to said first power supply voltage terminal, and a second terminal;
- a first transistor having a first current electrode coupled to said second terminal of said current source, a control electrode for receiving said input signal, and a second current electrode coupled to a second power supply voltage terminal;
- a second transistor having a first current electrode coupled to said first power supply voltage terminal, a control electrode coupled to said second terminal of said current source, and a second current electrode coupled to the output terminal of the linear output inverter; and
- a third transistor having a first current electrode coupled to said second current electrode of said second transistor, a control electrode coupled to the output terminal of the linear output inverter, and a second current electrode coupled to said second power supply voltage terminal.

* * * * *

UNITED STATES PATENT AND TRADEMARK OFFICE
CERTIFICATE OF CORRECTION

PATENT NO. : 5,546,047
DATED : August 13, 1996
INVENTOR(S) : Joseph Y. Chan and Mathew A. Rybicki It is certified that error appears in the above-indentified patent and that said Letters Patent is hereby corrected as shown below:

Column 6, line 19/20, Delete the first [a second input,]

Signed and Sealed this

Sixteenth Day of September, 1997

Attest:

BRUCE LEHMAN

*Attesting Officer*     *Commissioner of Patents and Trademarks*